(12) United States Patent
Albasini et al.

(10) Patent No.: US 7,005,928 B2
(45) Date of Patent: Feb. 28, 2006

(54) PHASE-LOCKED LOOP CIRCUIT WITH SWITCHED-CAPACITOR CONDITIONING OF THE CONTROL CURRENT

(75) Inventors: Guido Gabriele Albasini, Voghera (IT); Enrico Temporiti Milani, Pavia (IT); Giulio Ricotti, Broni (IT); Giovanni Frattini, Torre D'Isola (IT)

(73) Assignee: STMicroelectronics S.r.l., Agrate Brianna (IT)

( * ) Notice: Subject to any disclaimer, the term of this patent is extended or adjusted under 35 U.S.C. 154(b) by 5 days.

(21) Appl. No.: 10/798,244

(22) Filed: Mar. 11, 2004

(65) Prior Publication Data

US 2005/0001689 A1    Jan. 6, 2005

(30) Foreign Application Priority Data

Mar. 14, 2003    (EP) .................................. 03425156

(51) Int. Cl.
*H03L 7/00*    (2006.01)
(52) U.S. Cl. ......................................... 331/16; 327/148
(58) Field of Classification Search .................. 331/16, 331/17, 25, 175; 327/148, 157; 375/374
See application file for complete search history.

(56) References Cited

U.S. PATENT DOCUMENTS

| | | | |
|---|---|---|---|
| 4,179,670 A | 12/1979 | Kingsbury | 331/10 |
| 4,651,037 A | 3/1987 | Ogasawara et al. | 307/572 |
| 4,988,902 A | 1/1991 | Dingwall | 307/572 |
| 5,103,191 A | 4/1992 | Werker | 331/1 A |
| 6,107,889 A | 8/2000 | Strange et al. | 331/17 |
| 6,249,685 B1 | 6/2001 | Sharaf et al. | 455/550 |
| 6,342,818 B1 * | 1/2002 | Segawa et al. | 331/14 |
| 6,593,817 B1 | 7/2003 | Magazz' et al. | 331/17 |
| 6,714,772 B1 * | 3/2004 | Kasahara et al. | 455/260 |
| 2003/0071689 A1 | 4/2003 | Magazzu' et al. | 331/16 |

FOREIGN PATENT DOCUMENTS

| | | |
|---|---|---|
| EP | 0 856 946 A2 | 8/1998 |
| EP | 1 047 196 A1 | 10/2000 |
| JP | 61-134125 | 6/1986 |
| WO | WO 98/23035 | 5/1998 |

* cited by examiner

*Primary Examiner*—Linh My Nguyen
(74) *Attorney, Agent, or Firm*—Lisa R. Jorgenson; Robert Iannucci; Seed IP Law Group PLLC (57) ABSTRACT

A phase-locked loop circuit provides an output signal having a frequency depending on the frequency of a reference signal. The circuit includes a feedback circuit that derives a feedback signal from the output signal, a phase frequency detector that provides a control signal indicative of a phase difference between the reference signal and the feedback signal, a control circuit that controls the frequency of the output signal according to the control signal, and a conditioning circuit that conditions the control signal through a conditioning signal. The conditioning circuit includes a storage circuit that stores energy provided by the control signal and the conditioning signal during a first phase and transfers the accumulated energy to the control circuit during a second phase.

28 Claims, 6 Drawing Sheets

PHASE-LOCKED LOOP CIRCUIT WITH SWITCHED-CAPACITOR CONDITIONING OF THE CONTROL CURRENT

BACKGROUND OF THE INVENTION

1. Field of the Invention

The present invention relates to a Phase-Locked Loop (PLL) circuit.

2. Description of the Related Art

A PLL is a fundamental component of many electronic systems (for example, in telecommunication applications). The PLL consists of a negative feedback circuit that allows multiplication of the frequency of a reference signal by a selected conversion factor; this results in the generation of a tunable and stable output signal with the desired frequency.

Typically, the PLL includes a frequency divider that scales the frequency of the output signal by the conversion factor. The resulting signal is fed back to a phase comparator, which detects a phase difference between the feedback signal and the reference signal; the phase comparator outputs a control current indicative of the phase difference. A loop-filter integrates the control current into a corresponding voltage, which controls the frequency of the output signal accordingly. In a lock condition, the frequency of the feedback signal matches the frequency of the reference signal; therefore, the frequency of the output signal will be equal to the reference frequency multiplied by the conversion factor.

A problem of the structure described above is that different spurious signals (or spurs) can be generated during operation of the PLL. This problem is particularly acute in PLLs with a fractional architecture, wherein a dividing ratio of the frequency divider changes dynamically in the lock condition (so as to provide an average conversion factor equal to a fractional number); the fractional PLL allows finer resolution of the output frequency, and it exhibits improved performance in terms of both settling time and phase noise. However, the change in the dividing ratio causes fractional spurs at low-frequency offsets from a carrier that are multiple of the periodicity in the division pattern.

In order to remove the spurs generated during operation of the PLL, different techniques for conditioning the control current have been proposed in the last years.

For example, a solution known in the art for reducing the effects of the non-linearity of the phase comparator consists of sinking a direct current (DC) from an output node of the phase comparator. In this way, the PLL locks when the control current that is injected into the loop-filter during every cycle (consisting of a series of width-modulated pulses, indicative of the phase difference between the feedback signal and the reference signal) matches the current that is sunk, so that the average current provided to the loop-filter is zero. As a consequence, in the lock condition the reference signal and the feedback signal have the same frequency, but a pre-defined phase difference (thereby forcing the phase comparator to work in a part of its I/O characteristic that is more linear).

Another conditioning technique is routinely used in fractional PLLs for compensating a phase error, which is caused by the fact that in the lock condition the feedback signal and the reference signal are not instantaneously at the same frequency. For this purpose, a compensation current (consisting of a series of amplitude-modulated pulses) is sunk from the output node of the phase comparator. Each pulse of the compensation current has the same area as the corresponding pulse of the control current, so that in the lock condition the average current provided to the loop-filter during every cycle is zero.

A drawback of the solutions described above is that they increase the level of reference spurs at an offset around the carrier that is equal to the reference frequency. This is due to the fact that, although zero on the average, the current injected into the loop filter in the lock condition has an instantaneous value that is different from zero. As a consequence, the control voltage output by the loop filter exhibits a ripple at the operative frequency of the phase comparator.

BRIEF SUMMARY OF THE INVENTION

One embodiment of the present invention overcomes the above-mentioned drawbacks.

Briefly, one embodiment of the present invention provides a phase-locked loop circuit for providing an output signal having a frequency depending on the frequency of a reference signal. The circuit includes means for deriving a feedback signal from the output signal, means for providing a control signal indicative of a phase difference between the reference signal and the feedback signal, means for controlling the frequency of the output signal according to the control signal, and means for conditioning the control signal through at least one conditioning signal, wherein the means for conditioning includes means for accumulating an energy provided by the control signal and the at least one conditioning signal during a first phase and for transferring the accumulated energy to the means for controlling the frequency of the output signal during a second phase.

Moreover, a corresponding synthesizing method is also encompassed.

BRIEF DESCRIPTION OF THE SEVERAL VIEWS OF THE DRAWING(S)

Further features and the advantages of the solution according to the present invention will be made clear by the following description of a preferred embodiment thereof, given purely by way of a non-restrictive indication, with reference to the attached figures, in which.

DETAILED DESCRIPTION OF THE INVENTION

Figure 1:
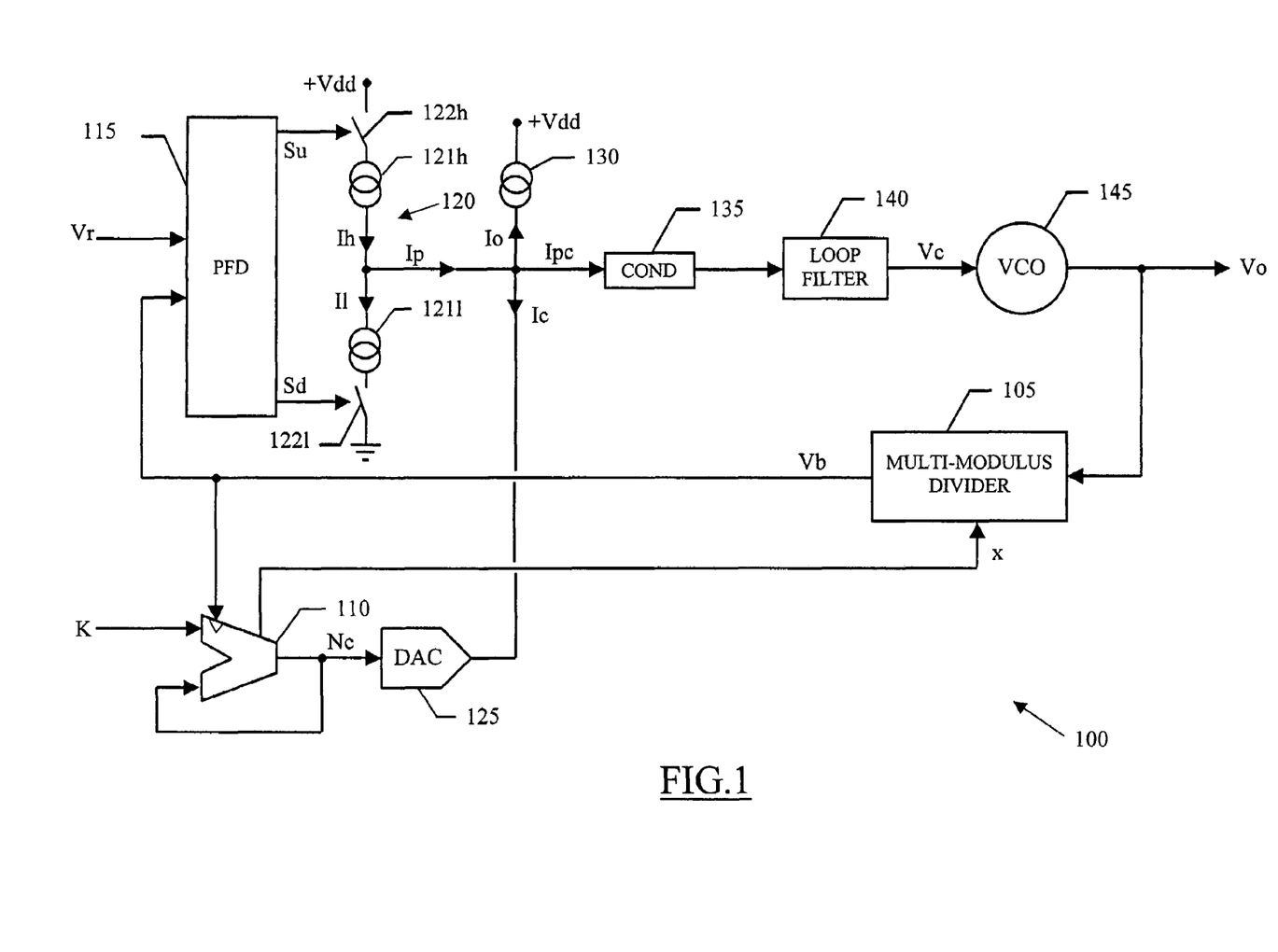
FIG. 1 shows the functional blocks of a PLL in which the invention is applicable.

With reference in particular to FIG. 1, a digital PLL 100 of the fractional type is shown. The PLL 100 is used to synthesize an output signal Vo with a desired frequency Fo. The output signal Vo is obtained multiplying a frequency Fr of a reference signal Vr by a selected conversion factor (consisting of a fractional number defining a channel of operation of the PLL 100); the reference signal Vr is typically generated by a quartz oscillator (not shown in the figure), which provides a stable and accurate time base.

For this purpose, the PLL 100 implements a feedback loop through a multi-modulus divider 105, which derives a signal Vb (having a frequency Fb) from the output signal Vo. Operation of the multi-modulus divider 105 is defined by a nominal value N (representing an integer component of the conversion factor). Assuming that the PLL 100 is implemented with a standard accumulator, the block 105 divides the frequency Fo of the output signal Vo by a dividing ratio that takes the values N or N+1 alternatively, according to a modulation bit x. The modulation bit x is provided by an overflow terminal of an accumulator 110 (clocked by the signal Vb). A first input of the accumulator 110 receives a further external signal K; the parameter K is an adjusting value consisting of an integer varying from 0 to a modulus M, equal to the capacity of the accumulator 110 (with the value K/M that represents a fractional component of the conversion factor). A second input of the accumulator 110 is directly connected to its output. The signal Vb resulting from the division performed by the block 105 is fed back to a Phase Frequency Detector (PFD) 115.

The PFD 115 detects a phase difference between the feedback signal Vb and the reference signal Vr either lower than +/−2π radians or higher than +/−2π radians (commonly referred to as frequency difference). The PFD 115 outputs a phase-indicator up-signal Su and a phase indicator down-signal Sd, which are used to control a charge pump 120. Typically, the charge pump 120 includes a high-side leg (referred to a power supply voltage +Vdd) and a low-side leg (referred to ground). The high-side leg consists of a current generator 121h (providing a current Ih), which is connected in series to an electronic switch 122h; likewise, the low-side leg consists of a current generator 121l (providing a current Il), which is connected in series to an electronic switch 122l. The switch 122h and the switch 122l are controlled by the up-signal Su and by the down-signal Sd, respectively. The high-side leg and the low-side leg are connected to each other, and define an output node of the charge pump 120 that supplies a current Ip.

As described in detail in the following, the content of the accumulator 110 represents a correction value Nc (for example, consisting of 4 bits). The correction value Nc is provided to a servo Digital-to-Analog Converter (DAC) 125 (clocked by the reference signal Vr). The servo-DAC 125 converts the correction value Nc into a corresponding compensation current Ic, which is sunk from the output node of the charge pump 120. Moreover, a current generator 130 (for example, referred to the power supply voltage+Vdd) provides a direct linearization current Io; the linearization current Io is further sunk from the output node of the charge pump 120.

A resulting control current Ipc=Ip-Ic-Io is injected into a conditioning block (COND) 135. The conditioning block 135 accumulates the energy provided by the control current Ipc; the accumulated energy is then transferred to a loop filter 140. The loop filter 140 removes the high frequency components of the control current Ipc; the control current Ipc is then integrated into a corresponding voltage Vc (every period of the reference signal Vr). The control voltage Vc drives a Voltage Controlled Oscillator (VCO) 145, which provides the output signal Vo.

During operation of the PLL 100, the VCO 145 starts oscillating at a free-run frequency as a consequence of background noise in the circuit. The block 105 divides the frequency Fo of the output signal Vo according to the adjusting value K. Particularly, in a fractional cycle consisting of M reference cycles, K times the frequency Fo of the output signal Vo is divided by N+1 rather than by N. The average dividing ratio over the whole fractional cycle is then:

$$N^* = \frac{K(N+1) + (M-K)N}{M} = N + \frac{K}{M}$$

In an unlock condition (such as during an initial power up or immediately after a channel switching), the frequency Fb of the feedback signal Vb is different from the frequency Fr of the reference signal Vr. The up-signal Su is asserted upon detection of a raising edge of the reference signal Vr; in response thereto, the switch 122h is closed and the current Ih is injected into the output node of the charge-pump 120. Likewise, the down-signal Sd is asserted upon detection of a raising edge of the feedback signal Vb; the switch 122l is then closed and the current Il is sunk from the output node of the charge-pump 120. The PFD 115 is reset after a short delay from the assertion of both the signals Su and Sd (in order to compensate a dead-zone of the charge pump 120); as a consequence, the switches 122h, 122l are opened so as to cut off the corresponding currents Ih,Il. The charge-pump current Ip then consists of a series of pulses indicative of the phase difference between the signals Vb and Vr.

The corresponding control voltage Vc (disregarding the compensation current Ic and the linearization current Io for the time being) updates the frequency Fo of the output signal Vo accordingly (every reference cycle). Particularly, when the feedback frequency Fb is lower than the reference frequency Fr, the control voltage Vc instructs the VCO 145 to increase the output frequency Fo; conversely, when the feedback frequency Fb is higher than the reference frequency Fr, the control voltage Vc instructs the VCO 145 to reduce the output frequency Fo.

Similar considerations apply to any phase difference between the feedback signal Vb and the reference signal Vr.

The PLL 100 locks when the average frequency of the feedback signal Vb matches the frequency Fr of the reference signal Vr. In this condition, the frequency Fo of the output signal Vo is thus equal to Fr*N* (on the average). Therefore, the PLL 100 delivers an output signal Vo with a frequency Fo having any desired value that is multiple of the frequency Fr of the reference signal Vr, according to the conversion factor N*=N+K/M.

However, in the lock condition the feedback signal Vb and the reference signal Vr are not instantaneously at the same frequency. Particularly, when the dividing ratio of the multi-modulus divider 105 is equal to N, the frequency Fb of the feedback signal Vb will be higher than the frequency Fr of the reference signal Vr; therefore, their phase difference increases. Conversely, when the dividing ratio of the multi-modulus divider 105 is equal to N+1, the frequency Fb of the feedback signal Vb will be lower than the frequency Fr of the reference signal Vr; therefore, their phase difference decreases.

The current value of the phase error (between the feedback signal Vb and the reference signal Vr) is available in the accumulator 110. In fact, the accumulator 110 sums the adjusting value K to itself continually. While the content of the accumulator 110 is lower then its capacity M, the frequency Fo of the output signal Vo is divided by N; when the accumulator 110 overflows, the dividing ratio is incremented to N+1. For example, with K=5 and M=16 (meaning that the accumulator 110 consists of a counter at 4 bits), the content of the accumulator 110 every fractional cycle will be:

5,10,15,4(↑),9,14,3(↑),8,13,2(↑),7,12,1(↑),6,11,0(↑)

A total of 5 overflows occur, so that the average dividing ratio becomes the desired conversion factor N*=N+5/16.

The phase error between the feedback signal Vb and the reference signal Vr is $2\pi K/M$ radians after the first reference cycle, $2\pi*2K/M$ radians after the second reference cycle, and so on. When the accumulator 110 overflows, the frequency Fo of the output signal Vo is divided by N+1; in this way, the phase error is decreased by a full cycle of the feedback signal Vb ($2\pi$). More generally, denoting with i the content of the accumulator 110, the phase error is always $2\pi*i/M$.

Therefore, it is possible to compensate the effects of the above-described phase error with a technique also known as phase interpolation. For this purpose, the content of the accumulator 110 (properly scaled) is converted into the corresponding compensation current Ic by the servo-DAC 125; the compensation current Ic is used to update the control current Ipc that is injected into the conditioning block 135 (and then provided to the loop-filter 140), in order to have a control voltage Vc that is constant in the lock condition.

The current generator 130 is instead used to reduce the effects of the non-linearity of a phase comparator formed by the PFD 115 and the charge pump 120. In fact, the phase comparator 115, 120 has an input/output characteristic (plotting an output charge against an input phase difference) that significantly differs from an ideal straight line. The non-linearity in the I/O characteristic of the phase comparator 115, 120 is generally higher when the phase difference between the feedback signal Vb and the reference signal Vr takes values near to zero.

In order to reduce the effects of that non-linearity, the phase comparator 115, 120 is forced to work in a linear part of its I/O characteristic; this result is achieved keeping the phase difference between the feedback signal Vb and the reference signal Vr different from zero in the lock condition. Particularly, the linearization current Io (provided by the current generator 130) updates the control current Ipc that is injected into the conditioning block 135 (and then provided to the loop-filter 140). The PLL 100 locks when the total current provided to the conditioning block 135 in every cycle is zero. In this condition, the reference signal Vr and the feedback signal Vb have the same frequency, but a pre-defined phase difference corresponding to the value of the linearization current Io (properly scaled).

However, the concepts of the present invention are also applicable when the PLL has another structure or includes equivalent elements; for example, the PFD can be replaced with a mixer or XOR-gates, or the positions of the current generators and of the switches in every leg of the charge pump can be reversed. Similar considerations apply if the PLL works with different operative parameters or if equivalent signals are envisaged. Alternatively, the accumulator is replaced with a second or higher order sigma-delta modulator or with a multi-bit modulator (with the addition of a control logic for calculating the correction value representing the current phase error).

Figure 2A:
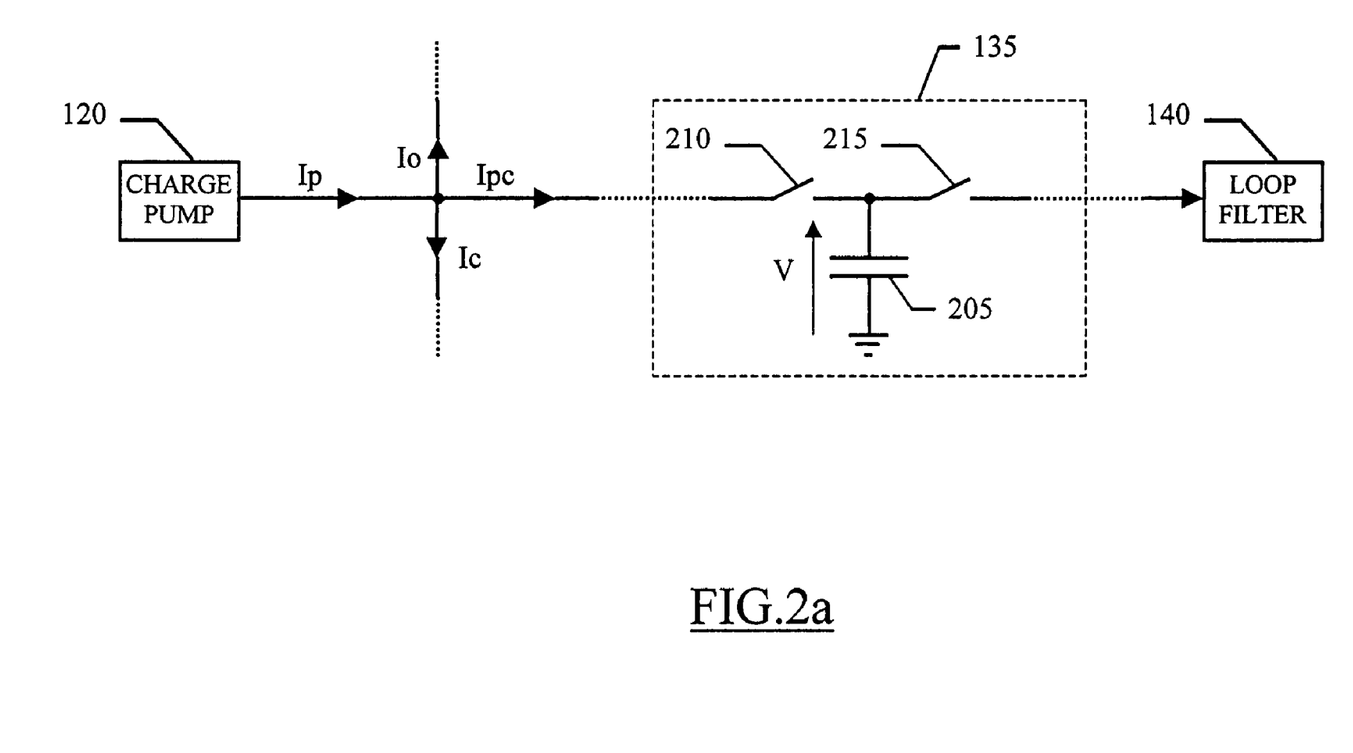
FIG. 2a is a schematic representation of a particular of the PLL.

The principle of operation of the conditioning block 135 is based on a switched-capacitor technique. A possible implementation of that principle is shown in FIG. 2a.

Particularly, the conditioning block 135 includes one or more capacitors, which are represented schematically by an element 205. The capacitive element 205 has a first terminal that is kept at a reference voltage (for example, ground). A second terminal of the capacitive element 205 is alternatively coupled with the charge pump 120 or with the loop-filter 140 (implemented with an active structure providing a virtual ground). For this purpose, one or more electronic switches (schematically represented by an element 210) are arranged between the charge pump 120 and the capacitive element 205; likewise, one or more further electronic switches (schematically represented by an element 215) are arranged between the capacitive element 205 and the loop-filter 140.

Every reference cycle, the switching elements 210 and 215 are alternatively opened and closed. Particularly, during a first phase (for example, consisting of half a period of the reference signal Vr) the switching element 210 is closed and the switching element 215 is open. As a consequence, the charge-pump current Ip, the compensation current Ic and the linearization current Io charge the capacitive element 205. During a second phase (consisting of a further half-period of the reference signal Vr) the switching element 210 is open and the switching element 215 is close. In this way, the capacitive element 205 discharges onto the (active) loop filter 140.

In the unlock condition, the control current Ipc=Ip–Ic–Io has a mean value different from zero (during the first phase); therefore, the control current Ipc causes the accumulation of an electric charge (either positive or negative) in the capacitive element 205 at the end of the first phase. During the second phase, the accumulated charge is transferred to the loop filter 140, so as to provide a corresponding control voltage Vc. Conversely, in the lock condition the control current Ipc is zero on the average. Therefore, the capacitive element 205 does not store any electric charge at the end of the first phase; therefore, during the second phase no electrical charge is transferred to the loop filter (with the control voltage Vc that is always constant).

Figure 2B:
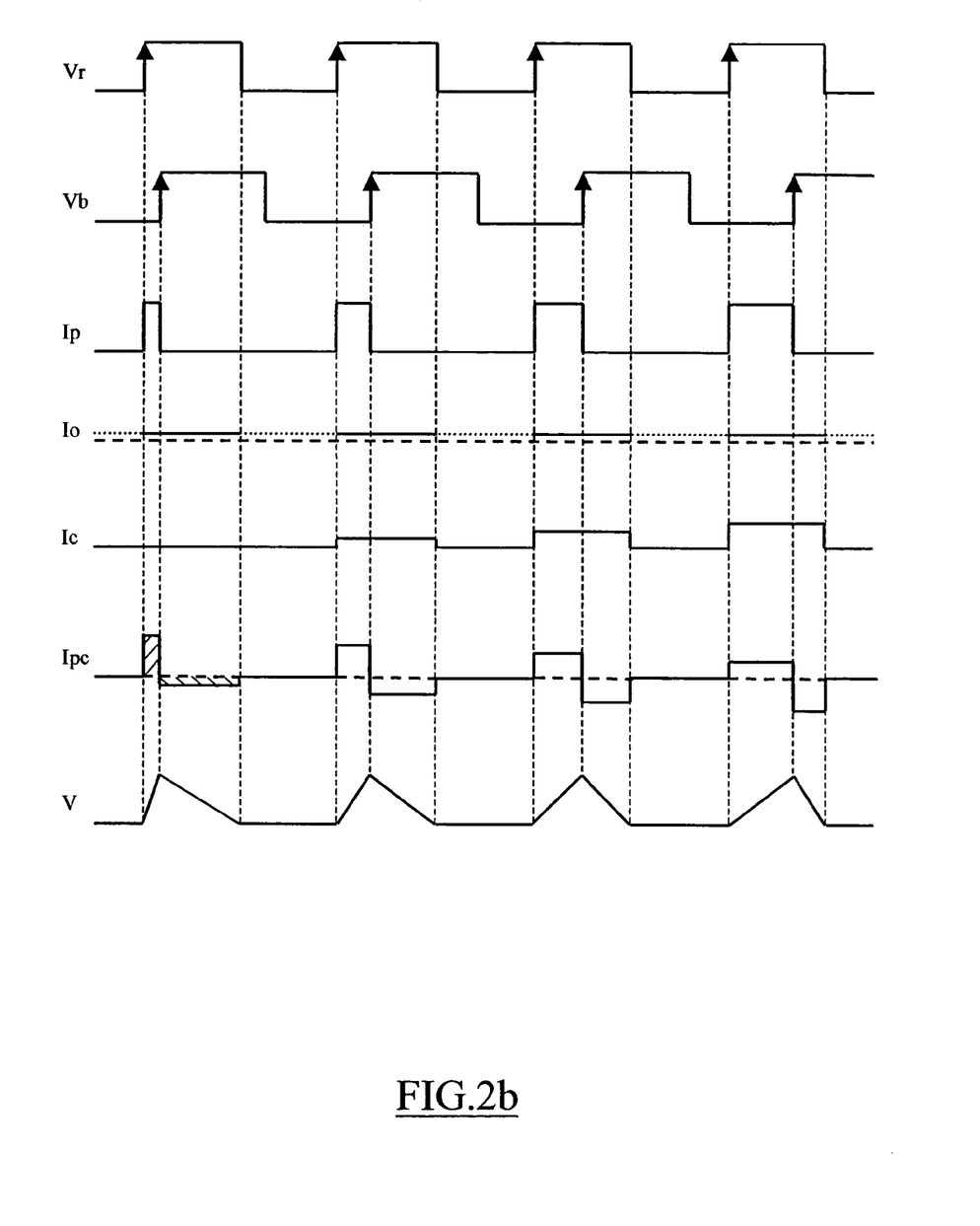
FIG. 2b is a simplified time diagram describing operation of the PLL.

For example, as shown in the simplified time diagram of FIG. 2b, the charge-pump current Ip consists of a series of pulses; each pulse has a width corresponding to the phase difference between the feedback signal Vb and the reference signal Vr (with a constant amplitude). The feedback signal Vb and the reference signal Vr have a pre-defined phase difference at the beginning of every fractional cycle. The phase difference then changes at every reference cycle, because of the phase error introduced by multi-modulus divider (with the phase difference that continually increases until the accumulator overflows).

The linearization current Io has a constant amplitude (corresponding to the desired phase difference); the linearization current Io is effective only during the first phase (first half-period of the reference signal Vr), so that it is represented with a dashed line during the second phase (second half-period of the reference signal Vr). The compensation current Ic consists of a series of pulses (for example, generated in response to the raising edges of the reference signal Vr). Each pulse has a constant width (for example, equal to half a period of the reference signal Vr); the amplitude of the pulse corresponds to the current phase error.

In an ideal condition, the mean value of the control current Ipc during every first phase is zero (i.e., the positive area is the same as the negative area). However, as shown in the figure, the instantaneous value of the control current Ipc is different from zero.

In the PLLs known in the art, the control current Ipc is directly injected into the loop-filter. The pattern of the control current Ipc (in the lock condition) has a periodicity equal to the fractional cycle. Therefore, the control current Ipc involves spurs at low-frequency offsets from a carrier Vo; particularly, a very powerful spur appears at an offset equal to Fr from the carrier Vo. The spurs cannot be removed by the loop filter, since that would require a too narrow loop bandwidth (with an intolerable increase of a settling time and of a phase noise in the PLL).

Conversely, in one embodiment of the present invention no current is injected into the loop-filter during the first phase. In the meanwhile, the voltage at the capacitive element of the conditioning block (denoted with V) increases when the control current Ipc is positive and decreases when the control current Ipc is negative. In this way, at the end of the first phase the voltage V is zero, so that no current is injected into the loop-filter during the second phase either. Therefore, the current provided to the loop-filter has an instantaneous value that is always zero.

Figure 2C:
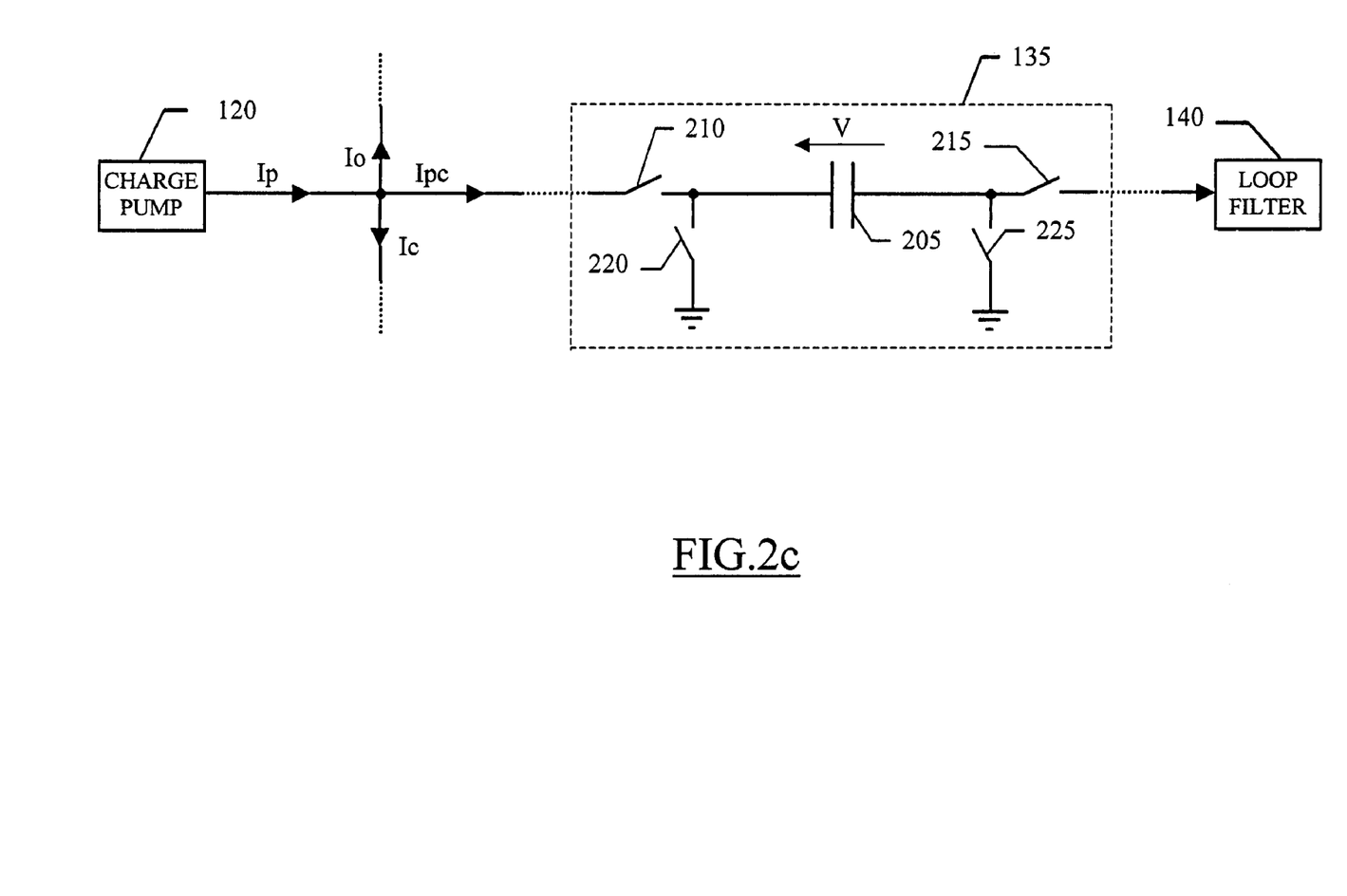
FIG. 2c depicts an alternative structure of the particular of the PLL.

An alternative implementation of the principle on which the present invention is based is shown in FIG. 2c (the elements corresponding to the ones shown in the FIG. 2a are denoted with the same references, and their explanation is omitted for the sake of simplicity). In this case, the capacitive element 205 is interposed between the switching element 210 and the switching element 215. The condition block 135 further includes two additional switching elements 220 and 225. The switching element 220 has a first terminal that is kept at ground; a second terminal of the switching element 220 is connected to a node that is shared between the switching element 210 and the capacitive element 205. Likewise, the switching element 225 has a first terminal that is kept at ground; a second terminal of the switching element 225 is connected to a node that is shared between the switching element 215 and the capacitive element 205.

During the first phase, the switching elements 210,225 are close (while the switching elements 215,220 are open). As a consequence, the currents Ip, Ic and Io charge the capacitive element 205. During the second phase, the switching elements 210,225 are open and the switching elements 215,220 are close. In this way, the capacitive element 205 discharges onto the loop filter 140.

The proposed structure improves the performance of the conditioning block 135 (even if it requires more components for its implementation).

However, the concepts of the present invention are also applicable when the conditioning block has an equivalent structure, or when the charging and discharging of the capacitive element are controlled in another manner. Similar considerations apply if the pulses of the compensation current have a different width or are generated in another way (for example, in response to the raising edges of the feedback signal). Alternatively, the signals are modulated with different techniques, or the linearization current is replaced with periodic pulses corresponding to the desired phase difference (between the feedback signal and the reference signal) in the lock condition.

Figure 3A:
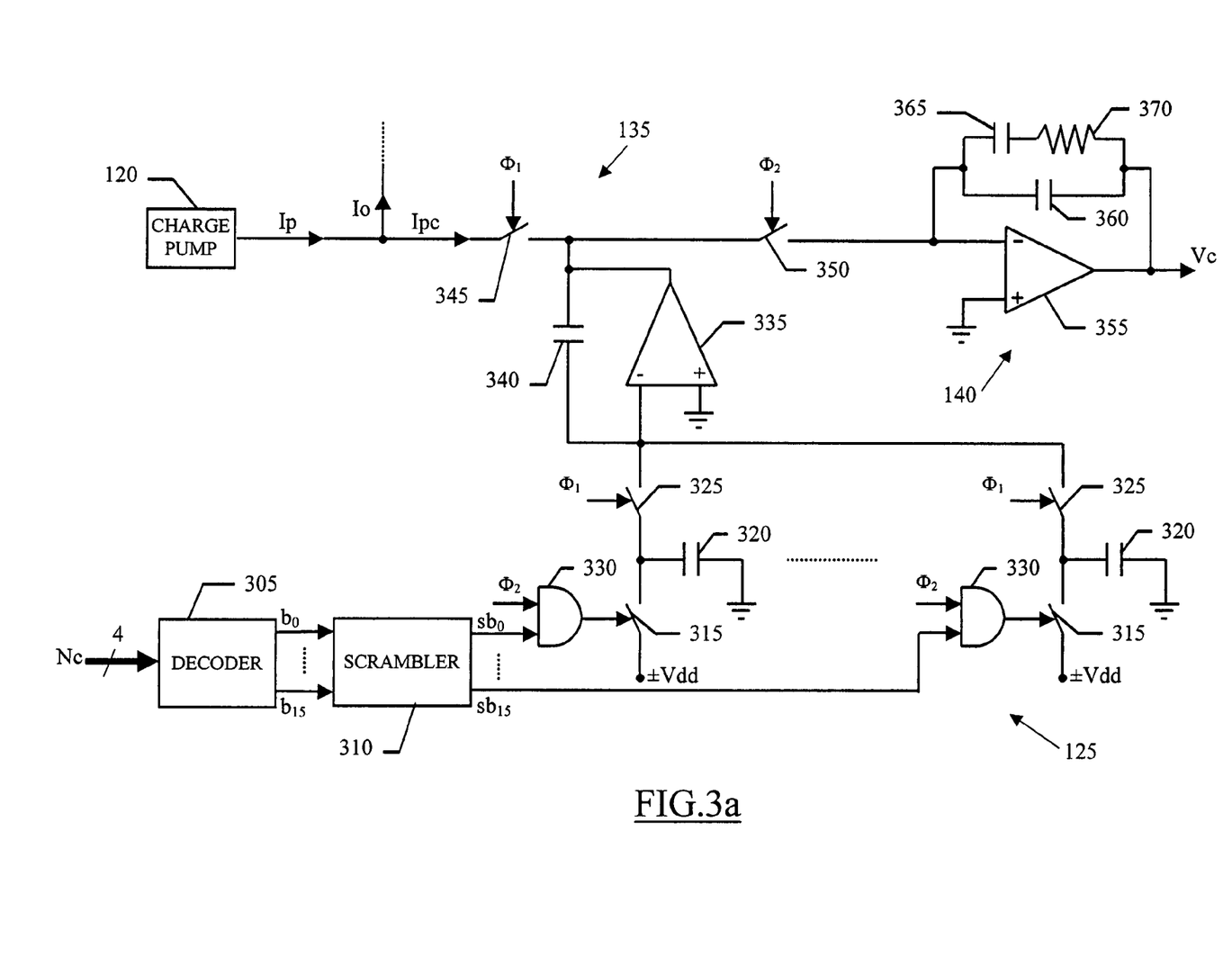
FIGS. 3a and 3b show different implementations of the invention.

A practical implementation of the present invention (based on a servo-DAC of the switched capacitor type) in a PLL using an accumulator is shown in FIG. 3a. Particularly, the servo-DAC 125 includes a decoder 305 receiving the correction value Nc. The decoder 305 converts the binary representation of the correction value Nc into a thermometric code. The thermometric representation of the correction value Nc consists of a number of bits $b_0$–$b_{15}$ equal to its maximum value ($2^4$=16 in the example at issue); the thermometric bits $b_0$–$b_{15}$ are of even weight, and each one corresponds to a possible level of the correction value Nc. The correction value Nc is represented setting to 1 all the thermometric bits $b_0$–$b_{15}$ up to the one corresponding to its value. For example, the correction value Nc=9 is represented by the thermometric bits 0000000111111111.

The thermometric bits $b_0$–$b_{15}$ are provided to a scrambler 310. The scrambler 310 has an input terminal for each thermometric bit $b_0$–$b_{15}$, and an even number of output terminals (each one providing a corresponding scrambled bit $sb_0$–$sb_{15}$). Each input terminal of the scrambler 310 is selectively connected to an output terminal according to either a random algorithm or a "barrel shift" algorithm. In the random algorithm, each thermometric bit $b_0$–$b_{15}$ is transferred to an output terminal selected in a pseudo-random way. Conversely, in the barrel shift algorithm the output terminals receive the thermometric bits $b_0$–$b_{15}$ at 1 along a wrap-around circular list; for example, the correction value Nc=7 causes the setting of the scrambled bits $sb_0$–$sb_6$, the next correction value Nc=11 causes the setting of the scrambled bits $sb_7$–$sb_{15}$,$sb_0$–$sb_1$, the further next correction value Nc=4 causes the setting of the scrambled bits $sb_2$–$sb_5$, and so on.

For each scrambled bit $sb_0$–$sb_{15}$, the servo-DAC 125 includes a block formed by a switch 315, a capacitor 320, a further switch 325, and an AND-gate 330. In detail, the capacitor 320 has a first terminal that is kept at a reference voltage (for example, at ground). The switch 315 connects a second terminal of the capacitor 320 to a power supply terminal (providing a voltage +Vdd or a voltage −Vdd according to the sign of the current corresponding to the correction value Nc that is to be injected into or sunk from, respectively, the loop filter 140). The switch 325 has a terminal connected to the second terminal of the capacitor 320. All the switches 325 have their other terminals that are connected together to a common node. The switch 325 is controlled by an enabling signal $\phi_1$. The switch 315 is controlled by a signal output by the AND-gate 330, which receives the corresponding scrambled bit $sb_0$–$sb_{15}$ and a different enabling signal $\phi_2$.

The servo-DAC 125 further includes an operational amplifier 335. The amplifier 335 has a non-inverting input terminal that is kept at ground, and an inverting input terminal that is connected to the common node of the switches 325. A capacitor 340 is arranged between the inverting input terminal and an output terminal of the amplifier 335.

A switch 345 connects the output terminal of the amplifier 335 to the output node of the charge-pump 120; the switch 345 is controlled by the enabling signal $\phi_1$. A further switch 350 connects the output terminal of the amplifier 350 to the loop-filter 140; the switch 350 is controlled by the enabling signal $\phi_2$.

The loop-filter 140 includes an operational amplifier 355 in an integrator configuration. The amplifier 355 has a non-inverting input terminal that is kept at ground, and an inverting input terminal that is connected to the switch 350. A capacitor 360 is arranged between the inverting input terminal and an output terminal of the amplifier 355. A further capacitor 365 and a resistor 370 are connected in series; the elements 365,370 are arranged in parallel to the capacitor 360, so as to define a filter. The output terminal of the amplifier 355 provides the control voltage Vc.

Every reference cycle, the enabling signal $\phi_1$ is at first asserted (with the enabling signal $\phi_2$ that is deasserted). In this way, the switches 325 and the switch 345 are closed (while the switches 315 and the switch 350 are opened). In an ideal condition, the charge stored in the capacitors 320 (as described in the following) is instantaneously transferred to the capacitor 340. The capacitor 340 is then charged by the currents Ip and Io. The enabling signal $\phi_1$ is kept asserted for a time interval (for example, half a period of the reference signal Vr) corresponding to the first phase.

The enabling signal $\phi_1$ is then deasserted (opening the switches 325 and the switch 345), and the enabling signal $\phi_2$ is asserted after a short delay (so that the signals $\phi_1$ and $\phi_2$ are disoverlapped). In this way, the signals output by the AND-gates 330 receiving the scrambled bits $b_0$–$b_{15}$ at 1 are asserted, and the corresponding switches 315 are closed (while the switches 315 associated with the scrambled bits $b_0$–$b_{15}$ at 0 remain open). The capacitors 320 associated with the scrambled bits $b_0$–$b_{15}$ at 1 are then charged to the power supply voltage $\pm$Vdd (so that the total electric charge that will be transferred to the capacitor 340 during the next first phase is proportional to the correction value Nc). At the same time, the switch 350 is closed; in this way, the electric charge accumulated in the capacitor 340 during the first phase (due to the currents Ip,Io and to the correction value Nc) is transferred to the capacitor 360 in the loop-filter 140. The enabling signal $\phi_2$ is then deasserted, thereby terminating the second phase.

In the above-describe architecture, the conversion of the correction value Nc is performed exploiting multiple identical components, which exhibit a high linearity. Moreover, when the scrambler 310 implements the random algorithm the capacitors 320 are statistically used with an even frequency; conversely, when the scrambler 310 implements the barrel shift algorithm the capacitors 320 are used in succession. In both cases, the periodic effects caused by the non-linearity of the servo-DAC 125 are substantially limited; as a result, any folding of the spurs is avoided, thereby reducing their power near the carrier.

Figure 3B:
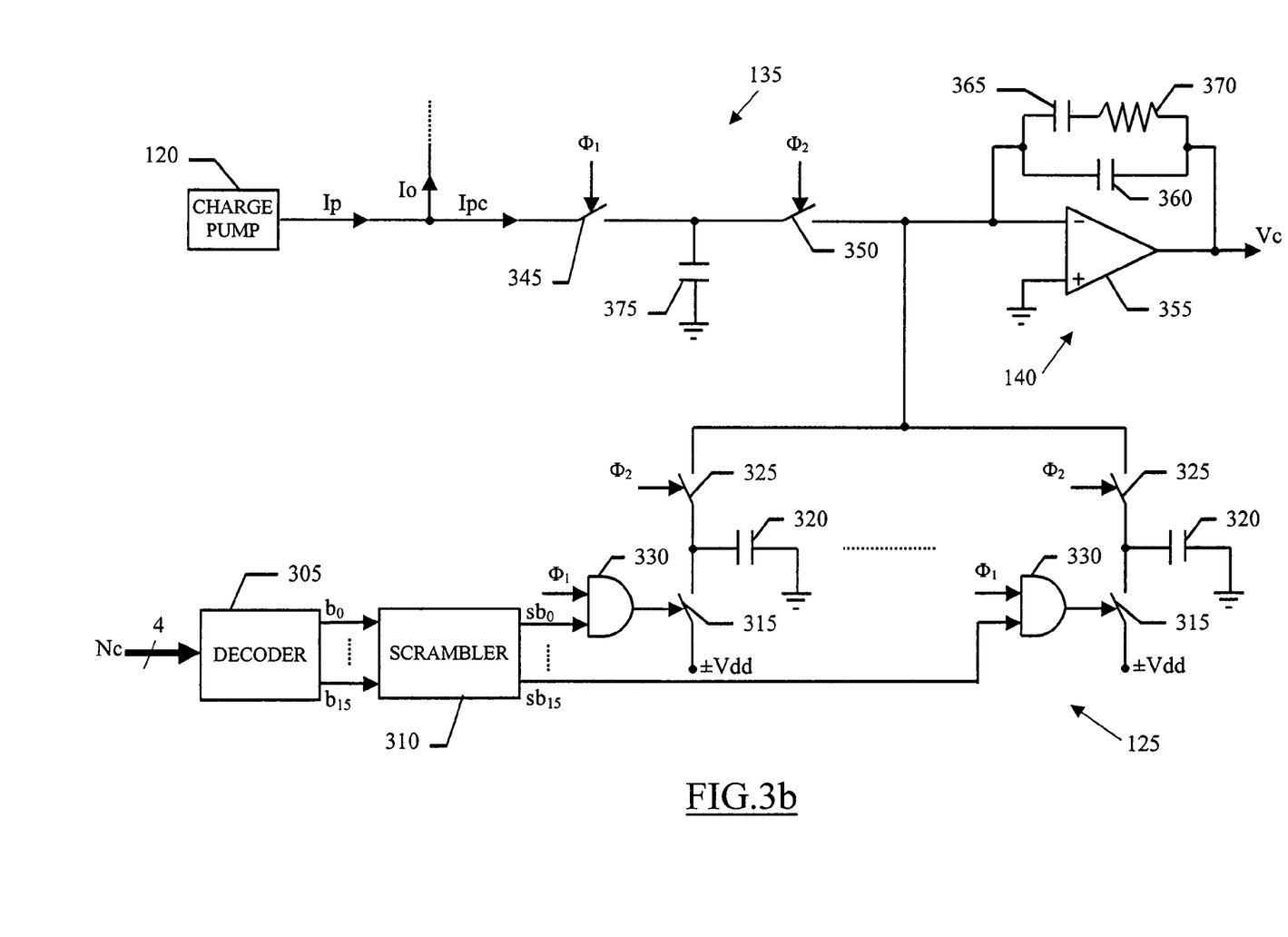

Moving now to FIG. 3b (the elements corresponding to the ones shown in the FIG. 3a are denoted with the same references, and their explanation is omitted for the sake of simplicity), an alternative implementation of the invention is illustrated. In this case, the AND-gates 330 receive the enabling signal $\phi_1$, while the switches 325 are controlled by the enabling signal $\phi_2$. The common node of the switches 325 is connected directly to the loop-filter 140 (without any operational amplifier and associated capacitor). The conditioning block 135 includes a further capacitor 375 having a first terminal that is kept at ground. A second terminal of the capacitor 375 is alternatively connected to the output node of the charge-pump 120 (through the switch 345) or to the loop-filter 140 (through the switch 350).

During the first phase (enabling signal $\phi_1$ asserted and enabling signal $\phi_2$ deasserted), the switch 345 is close; in this way, the capacitor 375 is charged by the currents Ip and Io. At the same time, the switches 315 associated with the scrambled bits $b_0$–$b_{15}$ at 1 are close, so that the corresponding capacitors 320 are charged to the power supply voltage $\pm$Vdd. During the second phase (enabling signal $\phi_1$ deasserted and enabling signal $\phi_2$ asserted), the switches 325 and the switch 350 are close (while the switches 315 and the switch 345 are open). In this way, the electric charge stored in the capacitor 375 (due to the currents Ip and Io) and the electric charge stored in the capacitors 320 (due to the correction value Nc) are transferred to the capacitor 360 in loop-filter 140.

However, the concepts of the present invention are also applicable when the servo-DAC and/or the loop-filter have another structure or include equivalent: components. Similar considerations apply if different thermometric representations and/or scrambling algorithms are employed; for example, two distinct paths are provided for positive correction values and for negative correction values, respectively (when the PLL is implemented with a multi-bit modulator).

More generally, one embodiment of the present invention proposes a phase-locked loop circuit, which is used for providing an output signal having a frequency depending on the frequency of a reference signal. The circuit includes means for deriving a feedback signal from the output signal. Further means are used for providing a control signal indicative of a phase difference between the reference signal and the feedback signal. The frequency of the output signal is controlled according to the control signal. Moreover, means are provided for conditioning the control signal through one or more conditioning signals. In the circuit of the invention, the means for conditioning includes means for accumulating an energy provided by the control signal and the conditioning signals during a first phase; the accumulated energy is then transferred to the means for controlling the frequency of the output signal during a second phase.

The solution of the invention allows a perfect conditioning of the control current (or any equivalent signal); particularly, the current provided to the means that are used for controlling the frequency of the output signal has an instantaneous value that is always zero in the lock condition.

In this way, any conditioning technique can be implemented in the PLL without affecting the level of the reference spurs (as in the structures known in the art).

Therefore, the devised solution results in an improvement of the overall performance of the PLL.

The preferred embodiment of the invention described above offers further advantages.

Particularly, the devised solution is based on the switched-capacitor technique.

This technique makes it possible to achieve the desired result with a very simple implementation.

However, the use of alternative techniques for accumulating energy and for transferring the accumulated energy during different operative phases of the PLL is contemplated.

Without detracting from the general applicability of the invention, the devised solution is particularly advantageous for compensating the phase errors in fractional PLLs.

The proposed conditioning scheme substantially deletes all the fractional spurs (without increasing the level of the reference spurs).

As a further enhancement, the servo-DAC (of the switched-capacitor type) and the conditioning block are controlled by the same enabling signals.

This structure makes it possible to exploit signals that are already available in the PLL.

In a proposed implementation of the invention, the output capacitor of the servo-DAC is also used for accumulating the electric charge provided by the control current (and the linearization current).

In another embodiment, all the input capacitors of the servo-DAC are directly connected to the loop-filter (with a dedicated capacitor for the control current and the linearization current).

Both structures reduce the number of additional components that are needed for putting the invention into practice.

However, the implementation of the solution according to the present invention is not excluded even in a PLL of the integer type or in a PLL without any frequency divider (always outputting a signal having the same frequency as the reference signal). Alternatively, the conditioning block is implemented in another way, the conditioning block and the servo-DAC exploit distinct enabling signals, or the servo-DAC has another architecture.

A way to further improve the solution is to convert the representation of the correction value into a thermometric code.

The proposed feature increases the linearity of the servo-DAC.

Advantageously, the thermometric bits representing the correction value are scrambled.

The devised solution reduces any periodic effect in the conditioning current.

However, the solution according to the present invention is suitable to be implemented with a different servo-DAC, and even without any conversion of the correction value and/or any scrambling of the thermometric bits.

In addition or in alternative, the solution of the invention is used for reducing the effects of the non-linearity of the phase comparator (PFD and charge pump).

Even in this case, the proposed conditioning scheme does not affect the level of the reference spurs.

However, the solution of the invention leads itself to be implemented with the compensation current or the linearization current only, with additional currents, or with any other signal for conditioning the control current.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

Naturally, in order to satisfy local and specific requirements, a person skilled in the art may apply to the solution described above many modifications and alterations all of which, however, are included within the scope of protection of the invention as defined by the following claims.

The invention claimed is:

1. A phase-locked loop circuit for providing an output signal having a frequency depending on the frequency of a reference signal, the circuit comprising:
  means for deriving a feedback signal from the output signal;
  means for providing a control signal indicative of a phase difference between the reference signal and the feedback signal;
  means for controlling the frequency of the output signal according to the control signal; and
  means for conditioning the control signal through a conditioning signal, wherein
  the means for conditioning includes means for accumulating energy provided by the control signal and the conditioning signal during a first phase and for transferring the accumulated energy to the means for controlling the frequency of the output signal during a second phase; and means for selectively applying the control signal and the conditioning signal to the energy accumulation means.

2. The circuit according to claim 1, wherein the means for conditioning includes capacitive means, first switching means responsive to a first enabling signal for coupling the capacitive means with the means for providing the control signal during the first phase, and second switching means responsive to a second enabling signal for coupling the capacitive means with the means for controlling the frequency of the output signal during the second phase.

3. The circuit according to claim 1, wherein the phase-locked loop circuit is of the fractional type for synthesizing the output signal multiplying the frequency of the reference signal by a fractional conversion factor, the means for deriving the feedback signal including means for dividing the frequency of the output signal by a dividing ratio being modulated to provide the conversion factor on the average, and wherein the means for conditioning includes means for providing a first conditioning signal for compensating a phase error caused by the modulation of the dividing ratio, the control signal consisting of a series of pulses modulated according to a first technique and the first conditioning signal consisting of a series of pulses modulated according to a second technique.

4. The circuit according to claim 3, further including means for providing a correction value indicative of the phase error, the correction value having at least one bit, and wherein the means for providing the first conditioning signal includes a digital-to-analog converter of a switched-capacitor type for converting the correction value into the first conditioning signal, the converter being controlled by the first and the second enabling signals.

5. The circuit according to claim 4, wherein the converter includes an output capacitor and, for each bit of the correction value, an input capacitor, a first switch for connecting the input capacitor to a power supply source in response to the second enabling signal and the corresponding bit, and a second switch for connecting the input capacitor to the output capacitor in response to the first enabling signal, the conditioning means including a further first switch for connecting the output capacitor to the means for providing the control signal in response to the first enabling signal and a further second switch for connecting the output capacitor to the means for controlling the frequency of the output signal in response to the second enabling signal.

6. The circuit according to claim 4, wherein the converter includes, for each bit of the correction value, an input capacitor, a first switch for connecting the input capacitor to a power supply source in response to the first enabling signal and the corresponding bit, and a second switch for connecting the input capacitor to the means for controlling the frequency of the output signal in response to the second enabling signal, the conditioning means including a further capacitor, a further first switch for connecting the further capacitor to the means for providing the control signal in response to the first enabling signal, and a further second switch for connecting the further capacitor to the means for controlling the frequency of the output signal in response to the second enabling signal.

7. The circuit according to claim 4, wherein the correction value includes a plurality of bits, the converter further including means for converting the bits of the correction value into a plurality of thermometric bits of even weight.

8. The circuit according to claim 7, wherein the converter further includes means for scrambling the thermometric bits.

9. The circuit according to claim 1, wherein the means for conditioning includes means for providing a second conditioning signal for causing the circuit to enter a lock condition when the reference signal and the feedback signal have the same frequency and a pre-defined phase difference, the control signal consisting of a series of pulses and the second conditioning signal having a constant amplitude corresponding to the pre-defined phase difference.

10. In a fractional-type phase-locked loop circuit, a method of providing an output signal having a frequency depending on the frequency of a reference signal, the method comprising the steps of:
  deriving a feedback signal from the output signal;
  providing a control signal indicative of a phase difference between the reference signal and the feedback signal;
  controlling the frequency of the output signal according to the control signal; and conditioning the control signal through a conditioning signal, wherein accumulating energy provided by the control signal and the conditioning signal responsive to a first phase of the reference signal, and transferring the accumulated energy for controlling the frequency of the output signal responsive to a second phase of the reference signal.

11. A phase-locked loop circuit for providing an output signal having a frequency depending on the frequency of a reference signal, the circuit comprising:

a charge pump generator including an output terminal;

a signal filter; and a first compensation circuit connected to an intermediate node between the output terminal of the charge pump generator and the signal filter, the first compensation circuit including:

a plurality of energy storage legs connected to the intermediate node and controlled by respective bits of a digital compensation signal, each energy storage leg being structured to store charge during a first phase if the bit controlling the energy storage leg is active and output the stored charge during a second phase.

12. The circuit of claim 11, wherein the first compensation circuit further includes a first capacitor connected between the energy storage legs and the intermediate node.

13. The circuit of claim 12, wherein the first compensation circuit further includes an amplifier connected between the energy storage legs and the intermediate node, the first capacitor being connected between an input and an output of the amplifier.

14. The circuit of claim 12 wherein the first compensation circuit further includes a first switch connected between the output of the charge pump and a first plate of the first capacitor and a second switch connected between the first plate of the first capacitor and the signal filter, the first and second switches being driven in phase opposition.

15. The circuit of claim 14 wherein each energy storage leg includes a second capacitor, a third switch connected between the second capacitor and the first capacitor, and a fourth switch connected between the second capacitor and a voltage reference; the first and third switches being controlled by a first control signal to open and close in tandem, and the second and fourth switches being controlled by a second control signal to open and close in tandem and in opposition to the first and third switches.

16. The circuit of claim 11 wherein each energy storage leg includes:

an energy storage element;

a switch connected between a voltage reference and the energy storage element; and an AND gate having a first input receiving the respective bit of the digital compensation signal, a second input receiving a phase control signal, and an output connected to a control terminal of the switch.

17. The circuit of claim 11, further including a second compensation circuit connected between the output of the charge pump and the signal filter, the second compensation circuit including a first energy storage element.

18. The circuit of claim 17 wherein the second compensation circuit further includes a first switch connected between the output of the charge pump and the first energy storage element and a second switch connected between the first energy storage element and the signal filter, the first and second switches being driven in phase opposition.

19. The circuit of claim 18 wherein each energy storage leg includes a second energy storage element, a third switch connected between the intermediate node and the second energy storage element, and a fourth switch connected between the second energy storage element and a voltage reference; the first and fourth switches being controlled by a first control signal to open and close in tandem, and the second and third switches being controlled by a second control signal to open and close in tandem and in opposition to the first and fourth switches.

20. The circuit of claim 1 wherein the first phase is a first phase of a period of the reference signal and the second phase is a second phase of the period of the reference signal.

21. The circuit of claim 20 wherein the first phase consists of a fist half-period of the reference signal and the second phase consists of a second half-period of the reference signal.

22. The method of claim 10 wherein the accumulating step includes accumulating the energy in an energy storage element in response to a first phase of a period of the reference signal and the transferring step includes transferring the accumulated energy in response to a second phase of the period of the reference signal.

23. A fractional phase-locked loop circuit for synthesizing an output signal having a frequency depending on a multiplication of a frequency of a reference signal by a fractional conversion factor, the circuit comprising:

means for deriving a feedback signal from the output signal that includes means for dividing the frequency of the output signal by a dividing ratio being modulated to provide the conversion factor on the average;

means for providing a control signal indicative of a phase difference between the reference signal and the feedback signal;

means for controlling the frequency of the output signal according to the control signal;

means for conditioning the control signal through a conditioning signal, wherein the means for conditioning includes:

means for accumulating energy provided by the control signal and the conditioning signal during a first phase and for transferring the accumulated energy to the means for controlling the frequency of the output signal during a second phase; and means for providing a first conditioning signal for compensating a phase error caused by the modulation of the dividing ratio, the control signal consisting of a series of pulses modulated according to a first technique and the first conditioning signal consisting of a series of pulses modulated according to a second technique.

24. The circuit according to claim 23, further including means for providing a correction value indicative of the phase error, the correction value having at least one bit, and wherein the means for providing the first conditioning signal includes a digital-to-analog converter of a switched-capacitor type for converting the correction value into the first conditioning signal, the converter being controlled by the first and the second enabling signals.

25. The circuit according to claim 24, wherein the converter includes an output capacitor and, for each bit of the correction value, an input capacitor, a first switch for connecting the input capacitor to a power supply source in response to the second enabling signal and the corresponding bit, and a second switch for connecting the input capacitor to the output capacitor in response to the first enabling signal, the conditioning means including a further first switch for connecting the output capacitor to the means for providing the control signal in response to the first enabling signal and a further second switch for connecting the output capacitor to the means for controlling the frequency of the output signal in response to the second enabling signal.

26. The circuit according to claim 24, wherein the converter includes, for each bit of the correction value, an input capacitor, a first switch for connecting the input capacitor to a power supply source in response to the first enabling signal and the corresponding bit, and a second switch for connecting the input capacitor to the means for controlling the frequency of the output signal in response to the second enabling signal, the conditioning means including a further capacitor, a further first switch for connecting the further capacitor to the means for providing the control signal in response to the first enabling signal, and a further second switch for connecting the further capacitor to the means for controlling the frequency of the output signal in response to the second enabling signal.

27. The circuit according to claim 24, wherein the correction value includes a plurality of bits, the converter further including means for converting the bits of the correction value into a plurality of thermometric bits of even weight.

28. The circuit according to claim 27, wherein the converter further includes means for scrambling the thermometric bits.

* * * * *